United States Patent [19]

Wang

[11] Patent Number: 5,051,793

[45] Date of Patent: Sep. 24, 1991

[54] COPLANAR FLASH EPROM CELL AND METHOD OF MAKING SAME

[75] Inventor: Samuel T. Wang, San Jose, Calif.

[73] Assignee: ICT International CMOS Technology, Inc., San Jose, Calif.

[21] Appl. No.: 328,964

[22] Filed: Mar. 27, 1989

[51] Int. Cl.[5] .................... H01L 29/78; H01L 27/10; G11C 11/40
[52] U.S. Cl. .................. 357/23.5; 357/23.1; 357/23.14; 357/54
[58] Field of Search .................... 357/54, 53, 41, 23.5, 357/23.1, 23.14

[56] References Cited

U.S. PATENT DOCUMENTS

| | | | |
|---|---|---|---|
| 4,258,466 | 3/1981 | Kuo et al. | 437/43 |
| 4,302,766 | 11/1981 | Guterman et al. | 437/43 |
| 4,514,897 | 5/1985 | Chiu et al. | 437/44 |
| 4,590,665 | 5/1986 | Owens et al. | 437/43 |
| 4,597,159 | 7/1986 | Usami et al. | 437/52 |
| 4,742,491 | 5/1988 | Liang et al. | 365/218 |
| 4,754,320 | 6/1988 | Mizutani et al. | 357/23.4 |
| 4,769,340 | 9/1988 | Chang et al. | 437/26 |
| 4,774,202 | 9/1988 | Pan et al. | 437/49 |
| 4,783,766 | 11/1988 | Samachisa et al. | 365/185 |
| 4,795,719 | 1/1989 | Eitan | 437/43 |
| 4,806,201 | 2/1989 | Mitchell et al. | 437/43 |
| 4,814,286 | 3/1989 | Tam | 437/30 |
| 4,852,062 | 7/1989 | Baker et al. | 365/185 |
| 4,868,617 | 9/1989 | Chiao et al. | 357/54 |
| 4,868,629 | 9/1989 | Eitan | 357/41 |
| 4,876,580 | 10/1989 | Nishizawa | 357/23.1 |
| 4,888,734 | 12/1989 | Lee et al. | 365/185 |
| 4,931,847 | 6/1990 | Corda | 357/23.3 |

FOREIGN PATENT DOCUMENTS

| | | | |
|---|---|---|---|
| 58-54668 | 3/1983 | Japan . | |
| 62-86764 | 4/1987 | Japan | 357/23.5 |
| 0136880 | 6/1987 | Japan | 437/52 |
| 63-36576 | 2/1988 | Japan | 357/23.5 |
| 0053978 | 3/1988 | Japan | 437/43 |
| 0066972 | 3/1988 | Japan . | |
| 0215079 | 9/1988 | Japan | 437/52 |
| 1-120862 | 5/1989 | Japan | 357/72 |

OTHER PUBLICATIONS

"Single-Device DRAM Cell Using Butted Plate", IBM TDB, vol. 27, No. 12, May 1985, pp. 7270–7271.

*Primary Examiner*—Andrew J. James
*Assistant Examiner*—Viet Q. Nguyen

[57] ABSTRACT

A flash EPROM cell is fabricated using a standard two polysilicon enhancement mode n-channel transistor process. An active transistor region is formed in a silicon substrate by growing a field oxide around the region. A first polysilicon layer is deposited, etched, and oxidized to form an insulated control gate electrode. A second polysilicon layer is deposited over the active transistor region and the control gate electrode and then anisotropically etched to remove all of the second polysilicon material except for a filament adjacent to the control gate electrode. The filament can be on one side of the control gate electrode or on opposing sides of the control gate electrode. Source and drain regions are formed in the active transistor region with the control gate electrode and the floating gate electrode positioned over the channel region interconnecting the source and drain regions. Two dopants (arsenic and phosphorus) are introduced into the source and drain regions with subsequent heat processing diffusing the phosphorous under a portion of the floating gate electrode. The arsenic and phosphorus form n+ and n− regions, respectively, in the source and drain regions thereby permitting higher gate-assisted avalanche breakdown in erasing the floating gate electrode. The cell is programmed by hot electron channel current injection by proper voltage biasing of the control gate and drain. The resulting cell structure can be either symmetrical or asymmetrical depending on the configuration of the floating gate filament.

6 Claims, 6 Drawing Sheets

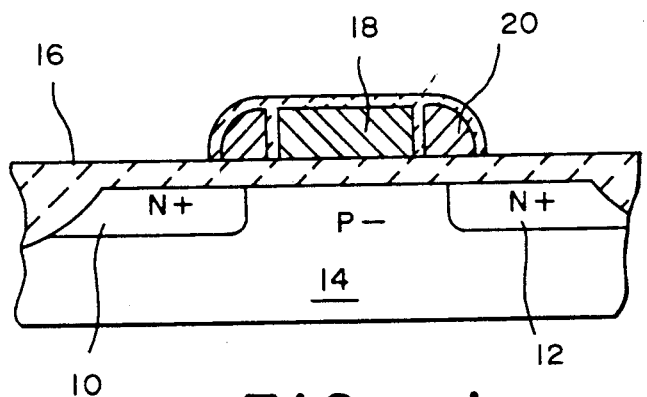
FIG.—1
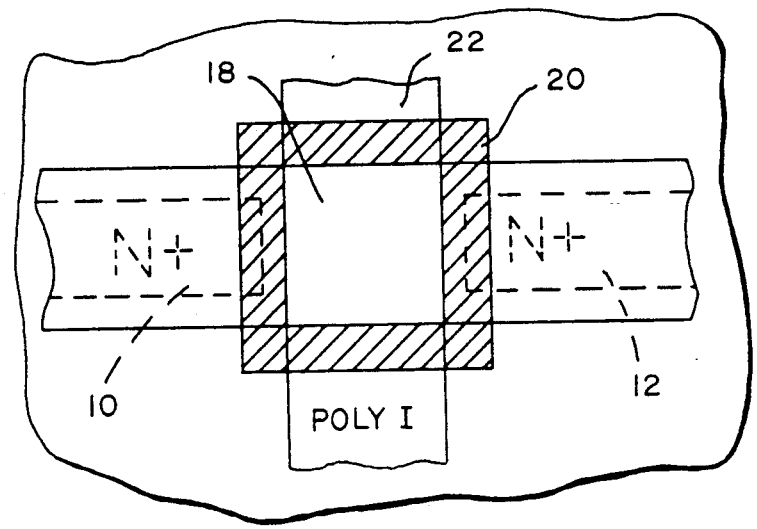
FIG.—2
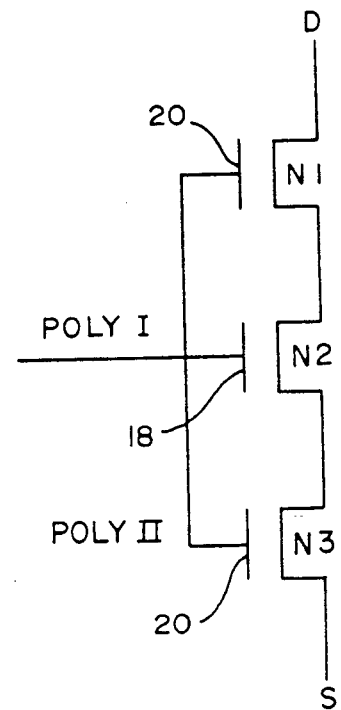
FIG.—4
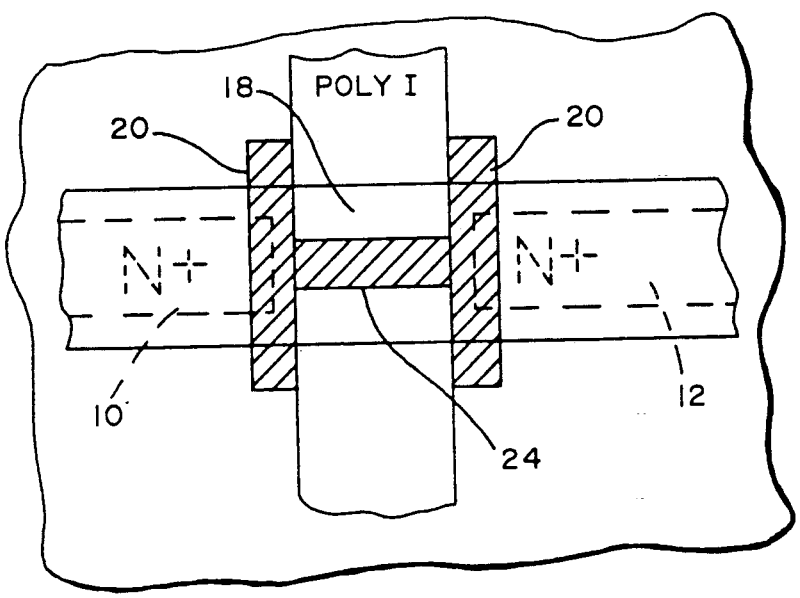
FIG.—3

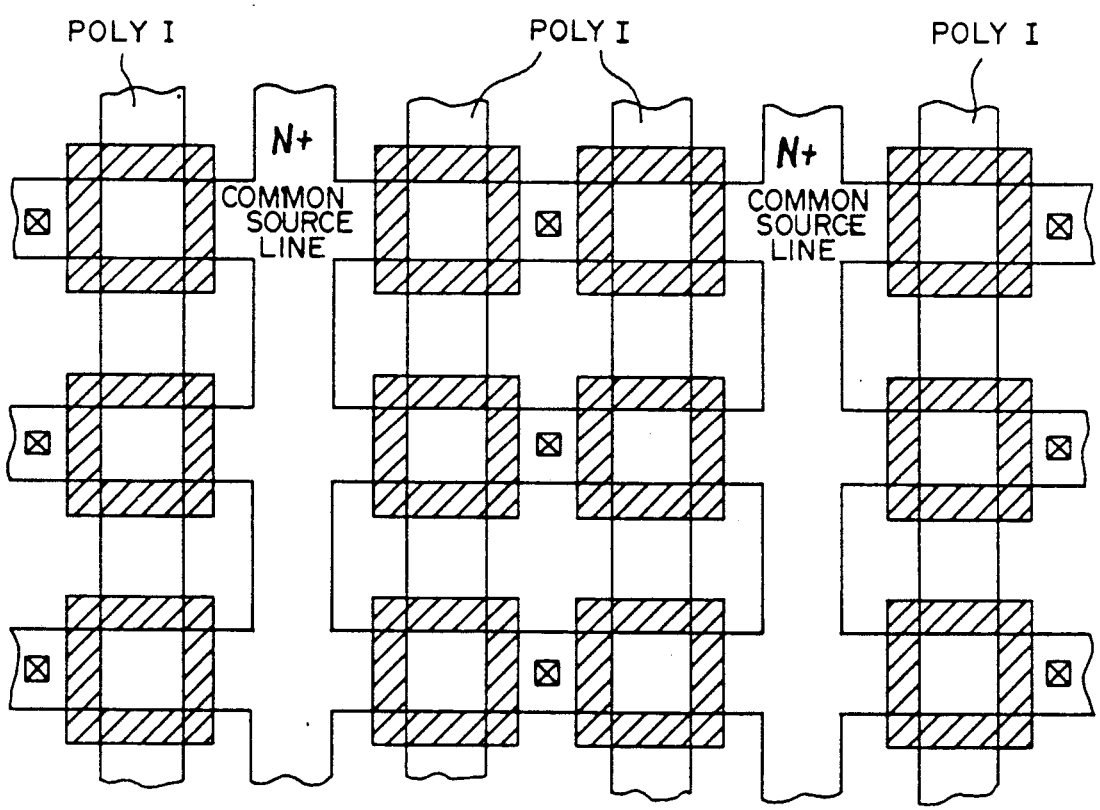
FIG.—5
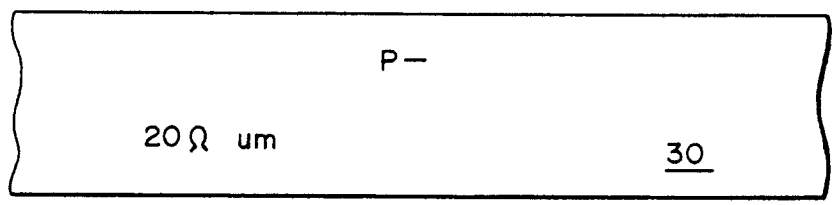
FIG.—6A
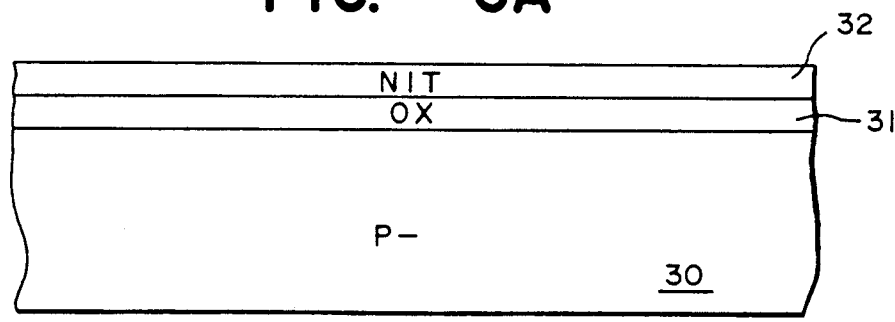
FIG.—6B

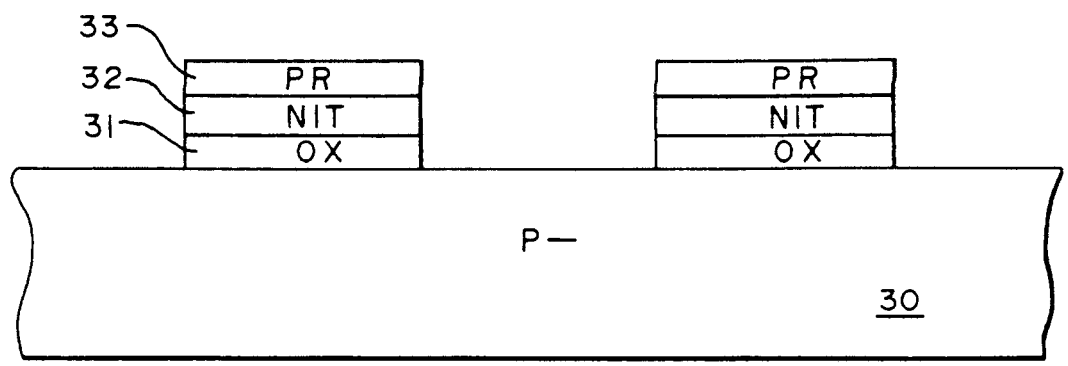
FIG.—6C
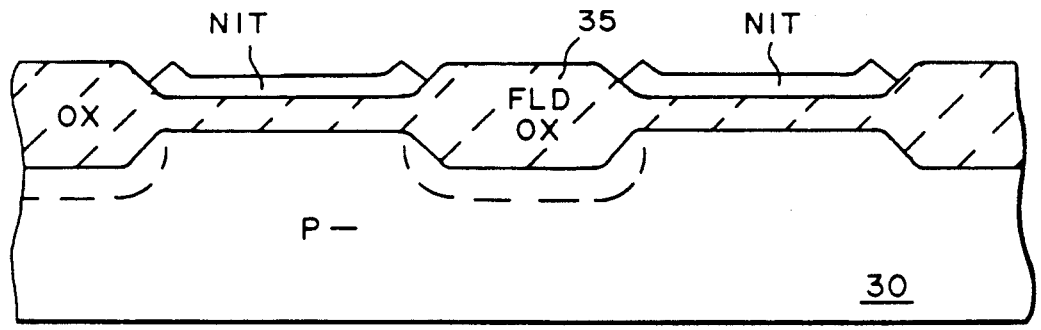
FIG.—6D
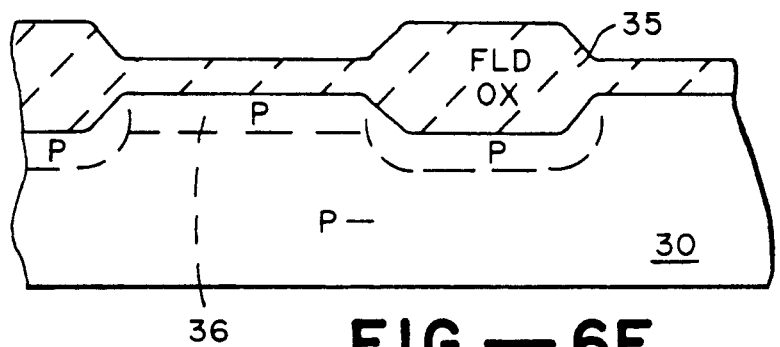
FIG.—6E
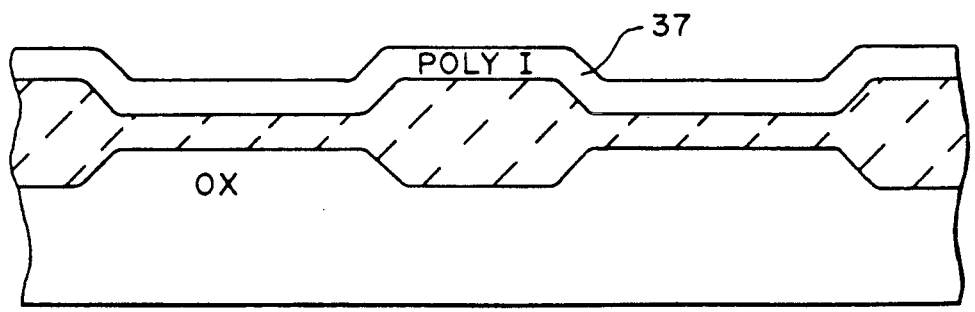
FIG.—6F

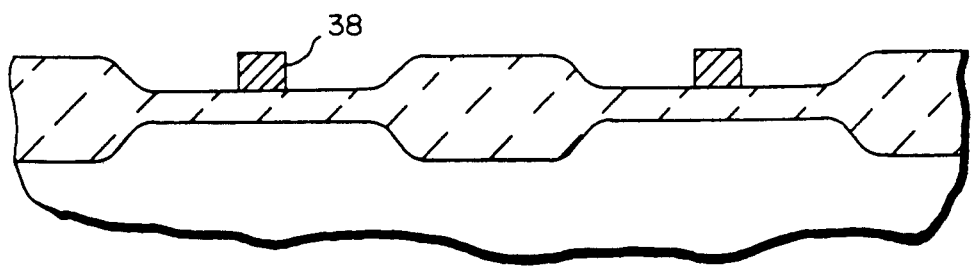
FIG.—6G
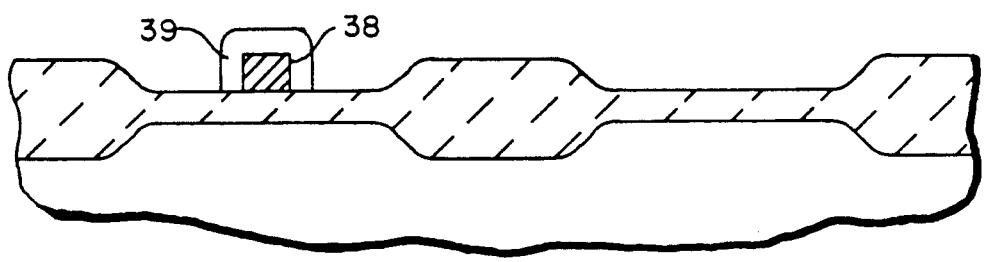
FIG.—6H
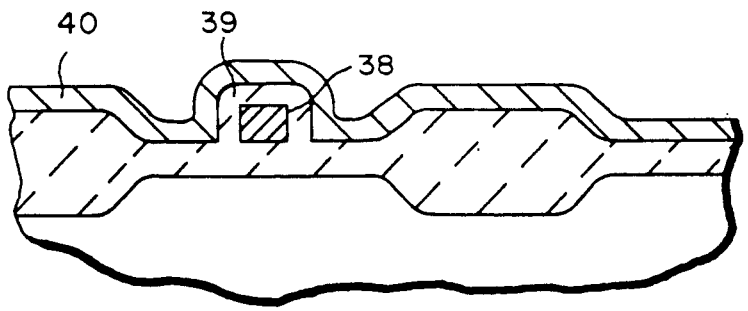
FIG.—6I
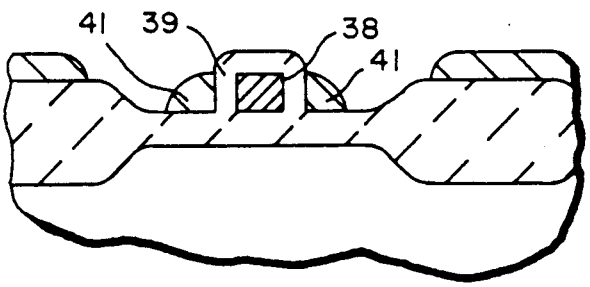
FIG.—6J
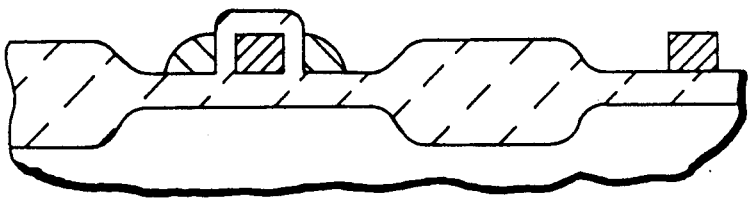
FIG.—6K

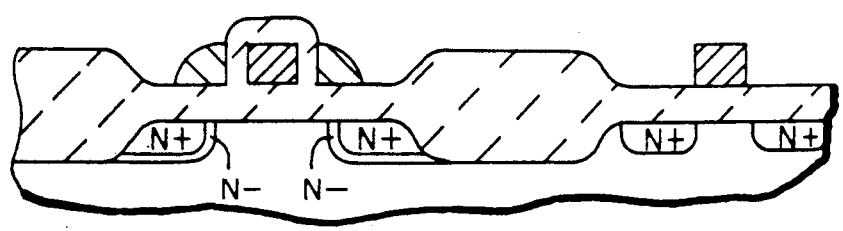
FIG.—6L
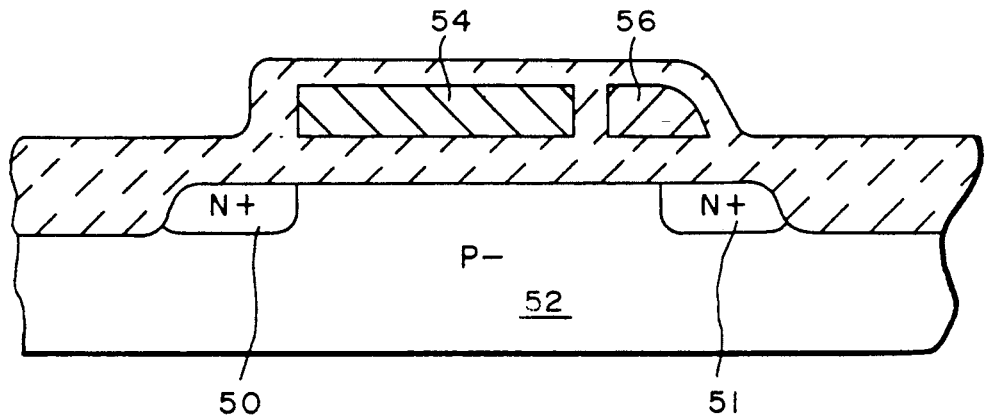
FIG.—7
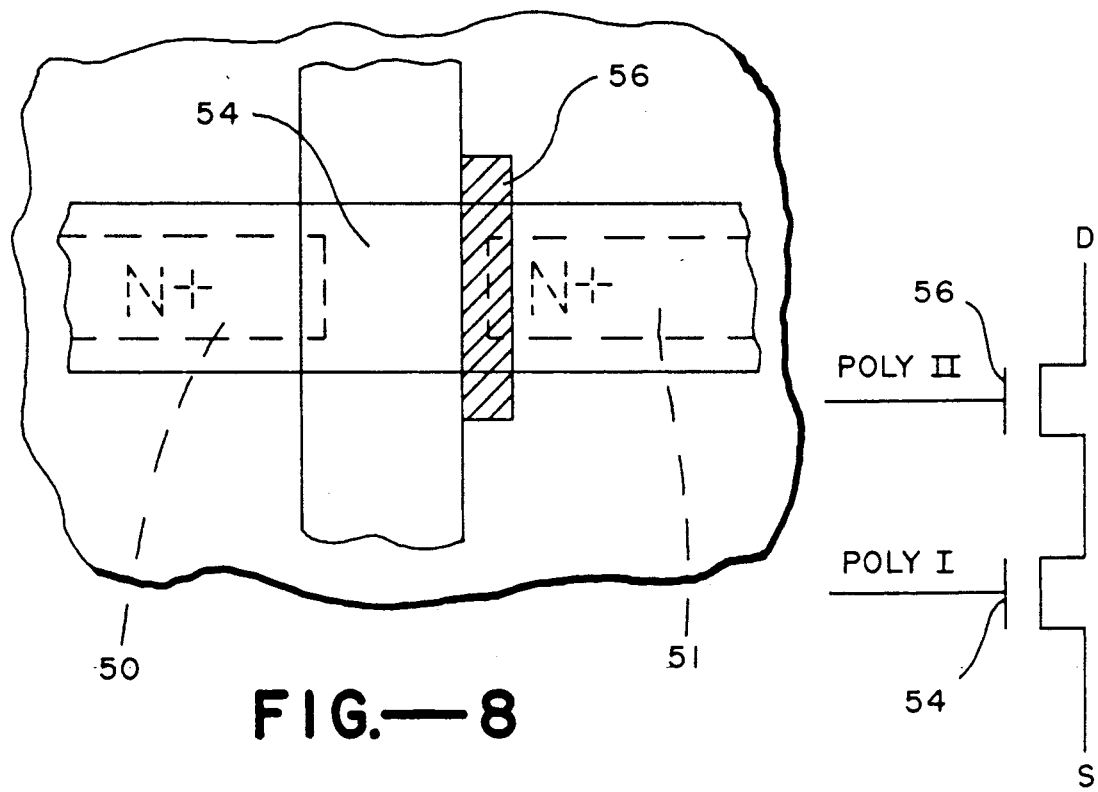
FIG.—8
FIG.—9

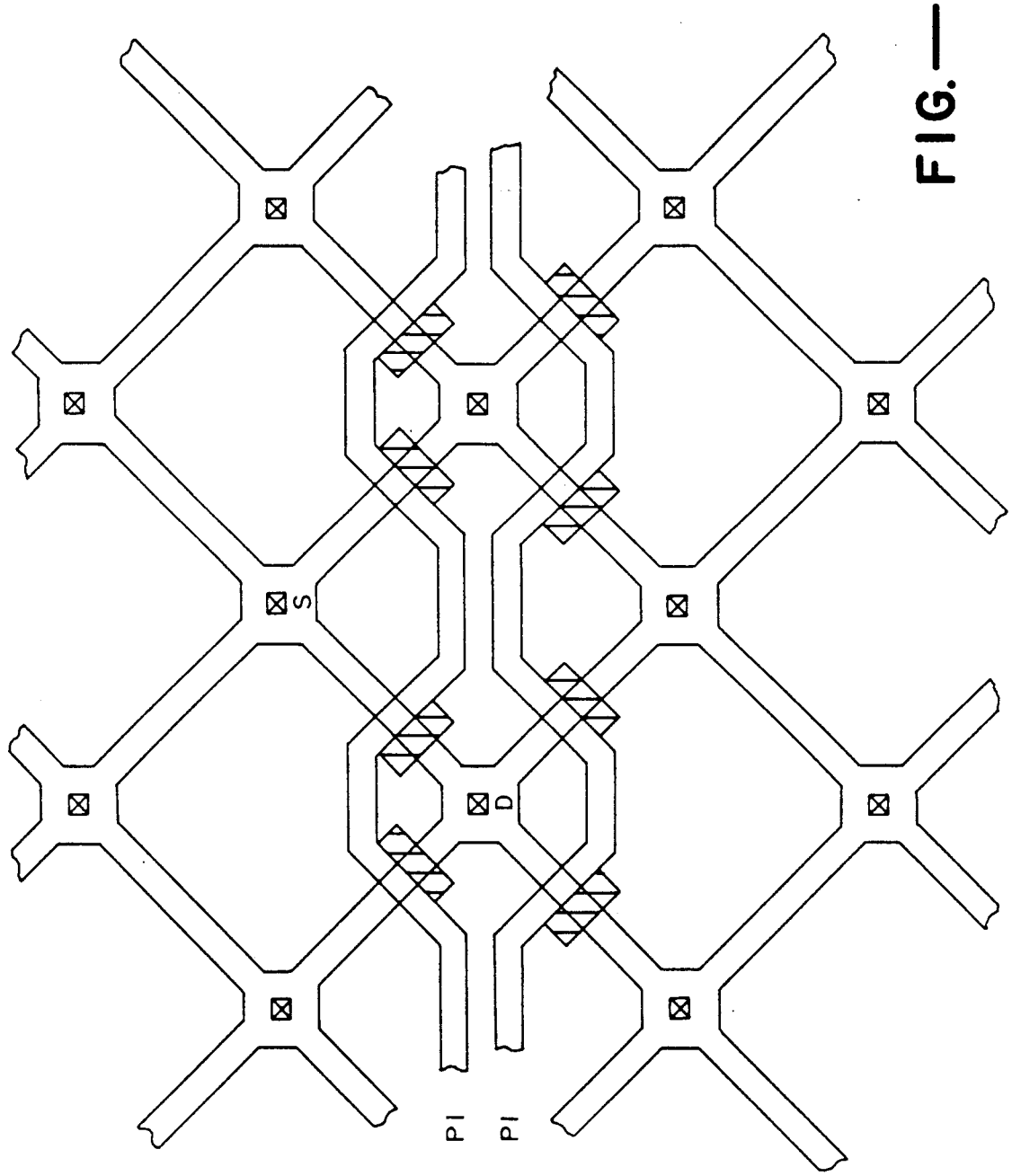
FIG.—10

COPLANAR FLASH EPROM CELL AND METHOD OF MAKING SAME

BACKGROUND OF THE INVENTION

This invention relates generally to semiconductor memory arrays, and more particularly the invention relates to a flash EPROM cell and array.

The EPROM cell is an electrically programmable device in which charge is selectively captured on a floating gate positioned between the control gate and the channel region of a field-effect transistor. In programming the floating gate, hot electron channel current injection results from applying a high voltage on the control gate and the drain. Electrons from the channel current are injected to the floating gate and cause $V_t$ of the transistor to increase. A programmed EPROM is erased by applying ultraviolet light to the device. Therefore, packaged EPROM devices require a window in the package for illuminating the semiconductor device with ultraviolet light.

The EEPROM memory cell is electrically programmable and electrically erasable A thin oxide is provided between a floating gate and either the source or drain electrode to permit the tunneling of electrons through the oxide for programming and erasing the cell. However, while the EEPROM obviates the need for ultraviolet light radiation in erasing a cell, the cell structure is larger due to the need for a select transistor cascoded to the memory transistor for proper bit erasure.

Flash EEPROM structures are known in which an entire memory array can be erased at the same time during an erase operation. Electron tunneling is employed in the erasing of the cells. The need for a thin tunneling oxide as well as the use of split gate structures in which the control gate overlaps the floating gate leads to production yield problems a well as increased cell size.

SUMMARY OF THE INVENTION

An object of the present invention is an improved flash EPROM cell.

Another object of the invention is a method of fabricating a flash EPROM cell which is compatible with standard polysilicon field-effect transistor fabrication processes.

Yet another object of the invention is a flash EPROM cell which has a size comparable to an EPROM cell.

Still another object of the invention is a flash EPROM cell in which programming and erasure does not require a tunneling oxide.

A feature of the invention is a cell structure in which a control gate and a floating gate are serially arranged to control the conduction of a channel of a field-effect transistor.

Another feature of the invention is a control gate formed of a first polysilicon material and a floating gate formed of a second polysilicon material with the two gates being generally coplanar and not overlapping.

Still another feature is the ability to byte erase selected cells rather than bulk erase the entire cell array.

Yet another feature of the invention is a filament floating gate on at least one side of a control gate of an EPROM cell transistor.

Briefly, a flash EPROM cell is fabricated in accordance with the invention by forming the control gate structure from a first doped polysilicon material over the active transistor region in a semiconductor body. The control gate in the first polysilicon layer is defined by selective etching and then the surface of the control gate is insulated by an oxide, for example. A second doped polysilicon layer is then formed over the active transistor region and over the insulated control gate structure. Importantly, the second polysilicon layer is thicker around the edges of the control gate structure. Consequently, the second polysilicon layer can be etched by anisotropic etchant or reactive ion etch to remove the second polysilicon material above the control gate structure while a portion of the second polysilicon material remains around the periphery of the control gate structure. This remaining portion becomes a coplanar filament floating gate for use in programming the cell.

Thereafter, the source and drain regions are formed by introducing dopants into the active region adjacent to the filament floating gate structure. Subsequent heat treatment causes diffusion of the dopants under a portion of the filament electrode so that the filament floating gate overlies at least one of the source and drain regions.

In one embodiment, the filament is around the periphery of the control gate on both the source and drain sides and the structure is symmetrical in structure. In another embodiment, the filament floating gate is retained on only one side of the control gate and the structure is asymmetrical. If the filament is on both sides of the control gate, the filament can be connected by a conductive bridge over the control gate, thereby allowing READ and PROGRAM control from the same side and obviating the need for drain/source switching.

In forming the source and drain regions, preferably both arsenic and phosphorus n-type dopants are introduced into the active regions. By using a higher concentration of arsenic than phosphorus, the faster-diffusing phosphorus will form a more gradual dopant profile with the p-doped channel region. This provides a higher junction breakdown voltage and facilitates the requisite gate-assisted breakdown needed to erase a cell.

The resulting structure has the control gate electrode and the floating filament gate electrode in series across the channel region between the source and drain of the memory transistor. When a cell is programmed as a "1" to conduct current upon application of a READ voltage to the control gate, the filament gate will be charged to effect a depletion mode in the underlying channel region. However, the channel region under the control gate is still in enhancement mode and no leakage current flows between the source and drain except during a READ cycle. Conversely, when the cell is programmed as a "0" with no current flow during a READ cycle, charge on the floating filament electrode prevents conduction across the channel between the source and drain during a READ cycle.

In the symmetrical structure, the programming of a cell entails hot electron channel current injection by applying high voltage on the control gate (e.g. +12 V) and on the drain (e.g. +7 V) while the source is grounded. Electrons from the channel current are injected to the floating filament electrode and cause $V_t$ of the transistor to go high. Thus the cell is nonconductive during a READ cycle.

Erasing of the cell is done by hole injection in a gate-assisted avalanche breakdown mode. The control gate is grounded and the source (or drain) is biased at +7 V while the drain (or source) is biased at 15+ V. The +7

V on one element is necessary to avoid the device experiencing punchthrough by +15 V on the other element. This causes the floating filament electrode to be charged by positive holes, thus rendering the channel region under the filament electrode to be in depletion mode. Erasure can be done on selected cells allowing the design feature of "byte erase."

With the asymmetrical structure, the source and drain electrodes must be reversed during the programming and READ modes. However, the asymmetric structure permits a virtual ground design with the cells arranged as an "X" array.

The invention and objects and features thereof will be more readily apparent from the following detailed description and appended claims when taken with drawing.

BRIEF DESCRIPTION OF THE DRAWING

FIG. 1 is a section view of a flash EPROM transistor cell in accordance with one embodiment of the invention.

FIG. 2 and FIG. 3 are alternative top views of the transistor cell of FIG. 1.

FIG. 4 is an electrical schematic of the flash EPROM transistor cell of FIG. 1.

FIG. 5 is a portion of a memory array using the flash EPROM cell of FIG. 1.

FIGS. 6A-6L are section views illustrating steps in fabricating the flash EPROM transistor cell of FIG. 1.

FIG. 7 is a section view of an alternative embodiment of a flash EPROM cell in accordance with the invention.

FIG. 8 is a top view of the flash EPROM cell of FIG. 7.

FIG. 9 is an electrical schematic of the flash EPROM transistor cell of FIG. 7.

FIG. 10 is a plan view of a portion of a memory array using the flash EPROM transistor cell of FIG. 7.

DETAILED DESCRIPTION OF ILLUSTRATIVE EMBODIMENTS

Referring now to the drawing, FIG. 1 is a section view of one embodiment of a flash transistor EPROM cell in accordance with the invention. The cell comprises an enhancement-mode field-effect transistor having an n+ source 10 and an n+ drain 12 fabricated in a p− substrate 14. A silicon oxide layer 16 is formed on the surface of the substrate 14 above the source 10 and drain 12. A polysilicon control gate 18 is provided on the oxide layer 16 between the source and drain regions, and a polysilicon filament electrode 20 is formed around the periphery of the control gate 18 and overlaps the source 10 and drain 12, as illustrated.

FIG. 2 is a plan view of the cell of FIG. 1 in accordance with one embodiment in which the filament electrode 20 completely surrounds the periphery of the control electrode 18 with the filament electrode 20 overlapping the source 10 and drain 12, illustrated in dotted lines. The control gate 18 is formed in a first polysilicon layer (poly 1) 22 which interconnects other control gates in one column.

FIG. 3 is an alternative plan view of the cell of FIG. 1 in which the floating filament electrode 20 is formed on either side of the control gate 18 and overlaps the source 10 and drain 12. In this embodiment the two filament portions 20 are interconnected by a conductive bridge 24 over the control gate 18. The width of the bridge can be the same as the filaments, and the bridge width will change the programming efficiency.

As will be described more fully below with reference to FIGS. 6A-6L, the control electrode 18 and the floating electrode 20 can be fabricated in a dual polycrystalline silicon process in which the control gate is formed from a first polysilicon layer and the floating filament electrode for programming the cell is fabricated from a second polysilicon layer. The control electrode and the floating electrodes are generally coplanar and are not overlapping, except for the bridge 24 in the embodiment of FIG. 3.

FIG. 4 is an electrical schematic of the cell of FIG. 1 in which the floating gate electrodes 20 and the control gate electrode 18 effectively form three serially-connected channel regions between the source and drain as illustrated. The serial enhancement transistor prevents current flows between the drain and source when the gate is grounded. Accordingly, when the cell is programmed for a "1", there is no leakage current when the cell is not being read.

FIG. 5 is a plan view of a portion of a memory array using the flash EPROM cell structure of FIG. 1. It will be noted that the polysilicon layers are formed in vertical columns with the control gates of all transistors in each column being interconnected by the poly 1 layer. The source regions of adjacent transistors are interconnected by common n+ source lines as illustrated. The drains of all transistors in horizontal rows are interconnected by metallization (not shown).

In programming the flash EPROM cells of FIG. 1, hot electron channel current injection to the floating gate is effected by applying a high voltage (e.g. 12 volts) to the control gate and a high voltage (e.g. +7 volts) to the drain with the source grounded. The symmetric structure allows the source and drain to be interchanged in the programming, READ and erase modes. Electrons from the channel current are injected to the Poly 2 filament and cause the $V_t$ of the Poly 2 filament channel to go high. Since the cell has the Poly 2 filament transistors in series with the Poly 1 control gate transistor, the $V_t$ of the cell becomes high and the cell is in an "off" state ("0" stored).

Erasing of the cell is done by hole injection in a gate-assisted breakdown mode. The control gate (Poly 1) is grounded and the source (or drain) is biased at 7 volts with the drain (or source) biased to more than 15 volts. This causes the filament Poly 2 electrodes to be charged by positive holes, forcing the Poly 2 filament channel regions to a depletion mode. However, the $V_t$ of the cell is limited by the $V_t$ of the series Poly 1 control gate electrode enhancement transistor, thus preventing the cell from going to a depletion mode. The $V_t$ of the transistor is low is this mode with the transistor programmed as a "1".

The cell structure of FIG. 1 is readily fabricated using a standard polysilicon process employing a Poly 1 layer and a Poly 2 layer. FIGS. 6A-6L are section views illustrating steps in the fabrication of the flash EPROM transistor cell of FIG. 1.

Initially, as shown in FIG. 6A, a 20 ohm-cm p− type silicon substrate 30 is provided. In FIG. 6B a silicon oxide 31 and silicon nitride 32 are formed on the surface of the substrate 30. Next, in FIG. 6C, the active regions of transistors are masked by photoresist 33, the nitride layer 32, and the oxide layer 31, thereby exposing portions of the substrate 30. In FIG. 6D, a field implant and field oxidation is formed in the exposed surface areas of the substrate 30 in accordance with standard processing techniques.

Thereafter, in FIG. 6E, a boron implant 36 is formed in the active transistor regions of the substrate to adjust $V_t$ to 0.5 volt. The oxide is then stripped from above the active transistor region and a gate oxide is regrown. A first doped polysilicon layer 37 is formed over the surface of the substrate and then etched as shown in FIG. 6G to form the control gates 38 and oxidized as shown at 39 in FIG. 6H to form the control gate electrodes of the transistor structures.

Thereafter, as shown in FIG. 1 6I, a second doped polysilicon (Poly 2) layer 40 is deposited by chemical vapor deposition (CVD) over the surface of the substrate and over the control gate 38 with the oxide 39 electrically insulating the Poly 2 layer from the gate electrode 38. The Poly 2 layer is thicker around the periphery of the Poly 1 lines and the control electrodes 38 due to the conforming nature of the CVD deposition.

In accordance with one feature of the invention, an anisotropic reactive ion plasma etch (RIE) is employed to remove the Poly 2 layer from over the control electrodes. However, the etch is limited in time so that the thicker Poly 2 layer around the periphery of the control electrode 38 remains as shown at 41 in FIG. 6J. This remaining Poly 2 layer becomes the filament floating gate electrode of the cell. In FIG. 6K, a second mask is employed to remove the Polysilicon 2 layer 40 between the adjacent transistors along the Poly 1 strips interconnecting gate electrodes of adjacent transistors.

Finally, in accordance with another feature of the invention, the source and drain regions are formed in the active transistor areas by implantation and subsequent diffusion of two n-type dopants, arsenic and phosphorus. The concentration of arsenic is greater than the concentration of phosphorus, and in a subsequent heat treatment following the implantation of the arsenic and phosphorus, the phosphorus diffuses faster and causes a dopant concentration profile as illustrated in FIG. 6L. The arsenic comprises the n+ region of the source and drain and the phosphorus comprises the n− portion of the source and drain. The lateral diffusion of the phosphorus causes overlap of the source and drain regions with the filament electrodes, as is necessary in programming and erasing each transistor cell. Further, the dopant concentration profile provided by the n+ arsenic and n-phosphorus regions permits higher gate-assisted breakdown for erasing a programmed transistor. As noted above, voltages as high as 15 volts are necessary for effecting the gate-assisted breakdown for flash erase, and the dopant profile permits the p-n junction between the source and drain contacts with the n− channel region to withstand the high reverse bias voltage. An abrupt n+/p− junction could not withstand the high voltages and would break down at 10-12 volts.

The symmetrical structure of the flash EPROM cell illustrated in FIG. 1 permits programming and erasing of the cell from either the source or drain of the transistor. However, an asymmetrical cell structure can be provided by retaining the polysilicon 2 [Poly 2] filament on only one side of the control gate electrode. This is illustrated in the side view of an alternative embodiment of FIG. 7. In this embodiment the n+ source 50 and n+ drain 51 are again formed in a p− substrate 52 with the control gate electrode 54 formed by Poly 1 material and the floating filament electrode 56 formed by a Poly 2 layer similar to the structure of FIG. 1 However, the Poly 2 is removed by etchant except from the one side of the control gate electrode.

FIG. 8 is a plan view of the cell and shows the filament 56 provided on only one side of the control gate 54 and overlapping only the drain 51. FIG. 9 is an electrical schematic in which the Poly 1 control gate 54 and the Poly 2 filament electrode 56 control serially-connected portions of the channel region between the source and drain.

In this asymmetrical cell structure, the source and drain electrodes must be interchanged between a READ mode and a programming or erase mode. Accordingly, the cells of a memory array are preferably aligned in an "X" matrix as shown in FIG. 10. During programming, 7 volts are applied to the drain, 12 volts are applied to the control gate, and the source is grounded for the selected cell while the source is allowed to float for the nonselected cells. This injects electrons to the floating filament electrode and raises the $V_t$ of the underlying channel region. Other nonselected cells have either floating source line or filament on the source side and are not affected by this operation. During an erase operation, the drain is raised to 23 volts, the control gate is grounded, and the source is allowed to float. Hole injection to the floating electrode occurs by gate-assisted avalanche breakdown. During a READ operation, the drain is grounded, 1 volt is applied to the source, and 3 volts are applied to the control gate. If the cell is programmed for a "0" (no current flow), the $V_t$ of the transistor will be 4+ volts. On the other hand, if the cell is programmed for a "1" (current flow), $V_t$ is 0.5 volt.

There has been described a flash EPROM cell which is small in structure (comparable to an EPROM cell) in which a polysilicon 1 material forms a control gate and a polysilicon 2 layer, generally coplanar with polysilicon 1 layer, forms a floating filament gate electrode. Since the channel regions underlying the control gate and the filament gate are in series, the transistor cell cannot go to a depletion mode even when the floating gate is in a depletion mode. In the symmetrical cell structure, the drain and source regions need not reversed between programming mode and a READ mode. Importantly, programming of the cell is accomplished by hot electron channel current injection and erasure is accomplished by gate-assisted breakdown hole injection. No tunneling oxide is required, thus simplifying the fabrication process.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

I claim:

1. A flash EPROM transistor cell comprising:
   a semiconductor body having a surface region of one conductivity type,
   first and second doped regions of opposite conductivity type formed in said surface region, said first and second regions being spaced and forming source and drain regions of said transistor cell with the surface region therebetween forming the channel region of said transistor.
   an insulative layer over said channel region,
   a control gate positioned on said insulative layer between said source and drain regions, said control gate being formed from a first doped polycrystalline silicon layer (Poly 1) and a floating gate positioned on said insulative layer between said source and drain regions and adjacent to opposing sides of said control gate, with said floating gate surrounding the periphery of said control gate, said floating gate being formed from a second doped polycrystalline silicon layer (Poly 2) said floating gate being spaced and electrically isolated from and generally coplanar with said control gate and overlapping both of said source and drain regions whereby said cell is programmed and erased by charge injection through said insulative layer between said floating gate contact and one of said source and drain regions.

2. A flash EPROM transistor cell comprising:

a semi conductor body having a surface region of one conductivity type, first and second doped regions of opposite conductivity type formed in said surface region, said first and second regions being spaced and forming source and drain regions of said transistor cell with the surface region therebetween forming the channel region of said transistor, an insulative layer over said channel region, a control gate positioned on said insulative layer between said source and drain regions, said control gate being formed from a first doped polycrystalline silicon layer (Poly 1)

a floating gate positioned on said insulative layer between said source and drain regions adjacent to opposing sides of said control gate, said floating gate being formed from a second doped polycrystalline silicon layer (Poly 2) said floating gate being spaced and electrically isolated from and generally coplanar with said control gate and overlapping both of said source and drain regions whereby said cell is programmed and erased by charge injection through said insulative layer between said floating gate contact and one of said source and drain regions, said floating gate including a bridge portion over said control gate which interconnects and floating gate overlapping said source region and said drain region.

3. The flash EPROM transistor cell as defined by claim 2 wherein each of said source region and said drain region includes varying concentrations of dopants of said opposite conductivity type.

4. The flash EPROM transistor cell as defined by claim 3 wherein said varying concentrations of dopants includes arsenic forming an n+ dopant concentration and phosphorus forming an n− dopant concentration.

5. The flash EPROM transistor cell as defined by claim 2 wherein said drain region includes varying concentrations of dopants of said opposite conductivity type.

6. The flash EPROM transistor cell as defined by claim 5 wherein said varying concentrations of dopants includes arsenic forming an n+ dopant concentration and phosphorus forming an n− dopant concentration.

* * * * *